US006892769B2

(12) United States Patent
Hong (10) Patent No.: US 6,892,769 B2
(45) Date of Patent: May 17, 2005

(54) SUBSTRATE BONDING APPARATUS FOR LIQUID CRYSTAL DISPLAY DEVICE PANEL (75) Inventor: Sang Pyo Hong, Kyonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/870,154

(22) Filed: Jun. 18, 2004

(65) Prior Publication Data

US 2005/0018122 A1 Jan. 27, 2005

(30) Foreign Application Priority Data

Jun. 30, 2003 (KR) .............................. 10-2003-0043489
May 18, 2004 (KR) .............................. 10-2004-0035191

(51) Int. Cl.[7] ................................................ B65B 1/04
(52) U.S. Cl. ..................... 141/65; 156/382; 156/285; 156/109
(58) Field of Search ........................... 141/4, 7, 8, 65, 141/98; 156/381, 382, 285, 109; 445/24, 25

(56) References Cited

U.S. PATENT DOCUMENTS 5,558,015 A * 9/1996 Miyashita et al. ............. 100/50
5,944,934 A * 8/1999 Park .......................... 156/285
5,964,630 A * 10/1999 Slusarczuk et al. ........... 445/25
6,793,756 B2 * 9/2004 Lee et al. .................... 156/228

* cited by examiner

Primary Examiner—Steven O. Douglas
(74) Attorney, Agent, or Firm—Morgan Lewis & Bockius LLP (57) ABSTRACT A substrate bonding apparatus for a liquid crystal display device panel includes an upper chamber plate, a lower chamber plate opposing the upper chamber plate, an upper low vacuum chamber provided on the upper chamber plate, a lower low vacuum chamber provided on a rear surface of the lower chamber plate, a sealing member provided on the lower chamber plate, the sealing member projecting from a top surface of the lower chamber plate at a predetermined height to contact the upper chamber plate to form a high vacuum chamber therein, at least two holes provided in each of the upper and lower chamber plates, at least two flow shut-off systems shutting off each of the holes, vacuum pumping system for reducing pressures of the upper and lower low vacuum chambers to low vacuum states, and reducing the high vacuum chamber to a high vacuum state, and upper and lower stages provided to upper and lower chamber plates, respectively, within an inside space of the high vacuum chamber to affix first and second substrates of the liquid crystal display device panel, respectively.

10 Claims, 5 Drawing Sheets

SUBSTRATE BONDING APPARATUS FOR LIQUID CRYSTAL DISPLAY DEVICE PANEL

The present invention claims the benefit of Korean Patent Application Nos. P2003-43489, filed in Korea on Jun. 30, 2003, and P2004-35191, filed in Korea on May 18, 2004 which are hereby incorporated by reference.

BACKGROUND OF THE INVENTION

1. Field of the Invention

The present invention relates to an apparatus for bonding substrates together, and more particularly, to a substrate bonding apparatus for a liquid crystal display (LCD) device panel.

2. Discussion of the Related Art

As demand for displaying various types of visual information increases, different types of display devices, such as LCD devices, plasma display panel (PDP) devices, electroluminescent display (ELD) devices, and vacuum fluorescent display (VFD) devices, are being developed. Among these different types of display devices, the LCD devices are commonly used in portable display devices and are used to replace cathode ray tube (CRT) devices because of their excellent image quality, light weight, thin profile, and low power consumption. In addition to the portable type LCD device, such as monitors of notebook computers, LCD devices are used in television systems for receiving and displaying broadcasting signals, and as monitors of desktop computers. However, despite the various technical advantages for using LCD devices as display devices, LCD devices lack high image characteristics, such as high definition and high luminance, and are difficult to implement in large-sized display screens.

The LCD devices are commonly fabricated using a liquid crystal injection process in which sealant is patterned upon one of upper and lower substrates to form an injection hole, and the upper and lower substrates are bonded together within a vacuum chamber. Then, liquid crystal material is injected through the injection hole into a region between the upper and lower substrates. Alternatively, a liquid crystal dispensing process is used, as suggested in Japanese Laid Open Patent Nos. 2000-284295 and 2001-005405. Accordingly, one of an upper and lower substrate has the liquid crystal material dispensed thereupon, and another of the upper and lower substrates is positioned adjacent to the substrate having the liquid crystal material, and they are bonded together under vacuum pressure.

Figure 1:
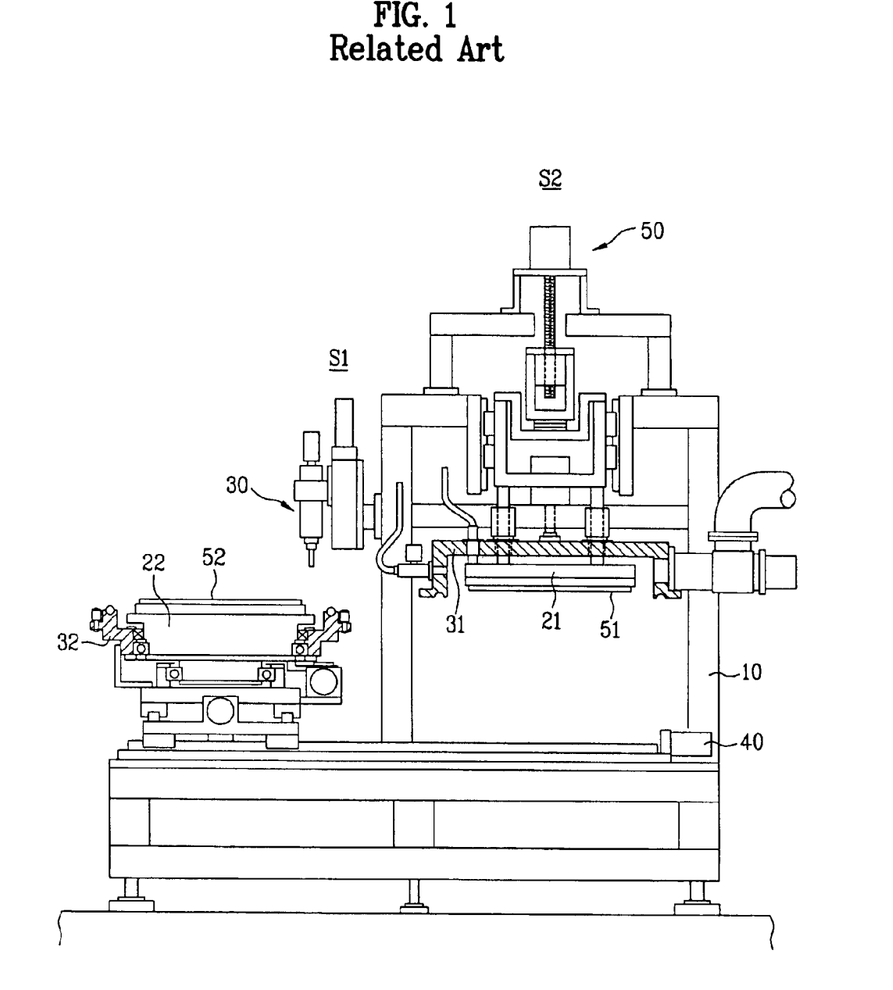
FIGS. 1 and 2 are cross sectional views of a substrate bonding apparatus for fabricating an LCD panel according to the related art.
Figure 2:
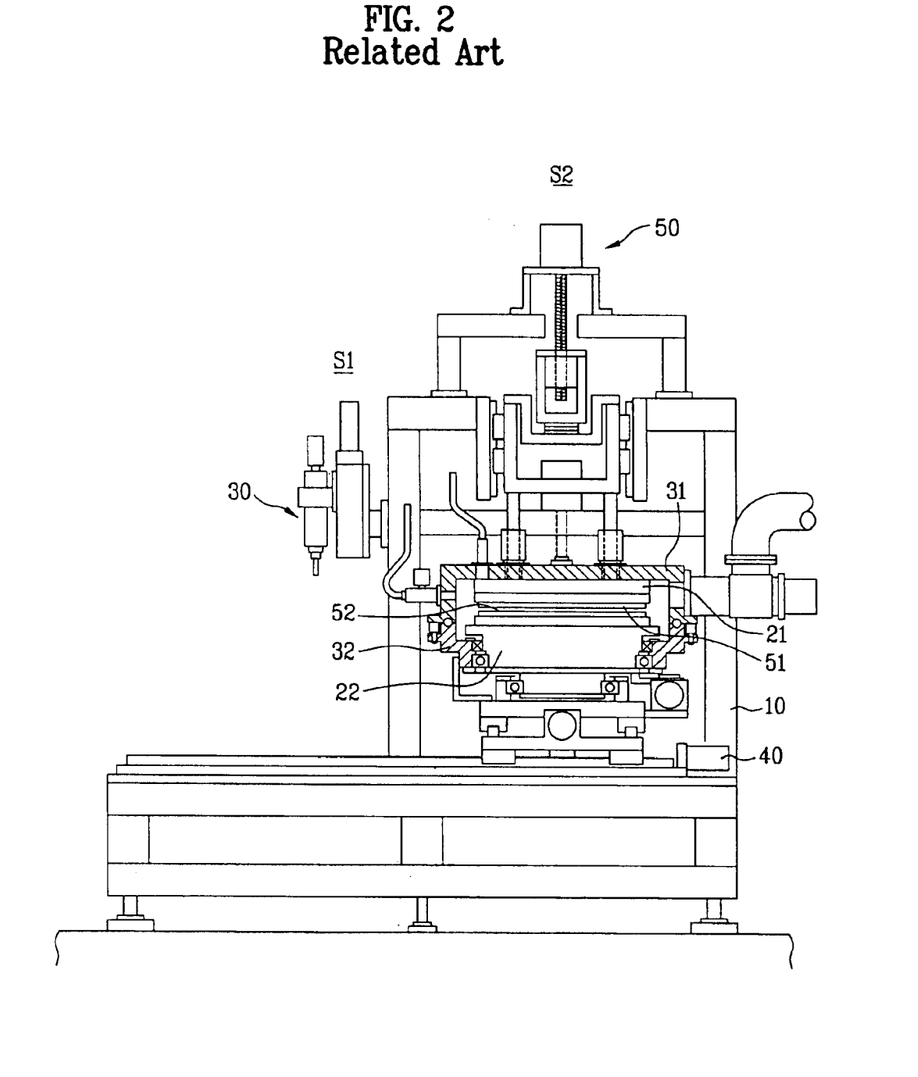

FIGS. 1 and 2 are cross sectional views of a substrate bonding apparatus for fabricating an LCD panel according to the related art. In FIGS. 1 and 2, a substrate bonding apparatus includes a frame 10 forming an outer appearance, an upper stage 21 disposed in an upper chamber part 31, a lower stage 22 disposed in a lower chamber part 32, and a liquid crystal material dispenser 30. In addition, although not specifically shown, the substrate bonding apparatus includes a sealant dispenser, a chamber moving device, and a stage moving device. The sealant dispenser (not shown) and the liquid crystal dispenser 30 are mounted at a side of a position the frame 10.

As shown in FIG. 2, the upper chamber part 31 and the lower chamber part 32 are joinable together. The chamber moving device includes a first driving motor 40 and a second driving motor 50. The first driving motor 40 that selectively moves the lower chamber unit 32 to a position S2 during a bonding process, or to a position S1 during dispensing of sealant from the sealant dispenser (not shown) and dispensing of liquid crystal material from the liquid crystal material dispenser 30. The second driving motor 50 selectively moves the upper stage 21 along vertical directions to the upper chamber part 31.

A process for fabricating an LCD device using the substrate bonding apparatus of FIGS. 1 and 2 according to the related art includes a loading process, as shown in FIG. 1, including attaching a first substrate 51 onto the upper stage 21 in a loaded state, and attaching a second substrate 52 onto the lower stage 22 in a loaded state. Next, the lower chamber part 32 having the lower stage 22 is moved to the position S1 by the first driving motor 40. Then, sealant material and liquid crystal material are dispensed onto the second substrate 52 by the sealant dispenser (not shown) and the liquid crystal material dispenser 30, respectively.

Next, as shown in FIG. 2, the second substrate 52 is moved to the position S2 by the first driving motor 40 for positioning the first and second substrates 51 and 52 together. Then, a joining process for joining the upper and lower chamber parts 31 and 32 together is performed by the first driving motor 40, thereby enclosing a space between the joined upper and lower chamber parts 31 and 32. Next, a pressure within the enclosed space is reduced to a vacuum state by a vacuum system (not shown). Under the vacuum state, the upper stage 21 is moved down by the second driving motor 50 so that a space between the first substrate 51 and the second substrate 52 is reduced. Accordingly, the first and second substrates 51 and 52 make contact with each other, and are pressed together by further movement of the second driving motor 50. Then, the upper stage 21 is withdrawn from the lower stage 22 such that the bonded first and second substrates 51 and 52 remain on the lower stage 22. Next, the pressure within the joined upper and lower chamber parts 31 and 32 is increased to an atmospheric pressure, and the joined upper and lower chamber parts 31 and 32 are separated. Then, the bonded first and second substrates 51 and 52 are removed from the lower stage, thereby completing the process for fabricating an LCD device.

However, the process for fabricating the LICD device has the following disadvantages. First, since the bonding apparatus requires dispensing of the sealant material and the liquid crystal material onto one of the substrates and bonding of the substrates together, the overall size of the substrate bonding apparatus must be large. Accordingly, as sizes of substrates increases, an overall size of the bonding apparatus must also increase. Thus, the bonding apparatus has a maximum limit both for the size of substrates that may be bonded together, and for a physical limitation of the bonding apparatus itself.

Second, since the lower chamber part 32 must be repeatedly moved between the first second positions S1 and S2 during each bonding process, alignment between the upper and lower stages 21 and 22, and subsequently, between the first and second substrates 51 and 52 may become inaccurate.

Third, since the upper and lower chamber parts 31 and 32 are repeatedly joined together and separated apart, sealing of the upper and lower chamber parts 31 and 32 may deteriorate. Accordingly, air and foreign matter may be allowed to enter into an interior portion of the joined upper and lower chamber parts 31 and 32. Thus, defective bonding of the substrates will occur.

Fourth, the substrate bonding apparatus according to the related art requires a relatively large space for performing bonding of the substrates. Thus, a facility to house the frame of the substrate bonding apparatus requires an unnecessarily large amount of unusable floor space, thereby reducing space efficiency and increasing manufacturing costs. In addition, the substrate bonding apparatus requires a significant amount of process time to produce the bonded substrates, and power consumption for generating the vacuum pressure within the joined upper and lower chamber parts is relatively large.

SUMMARY OF THE INVENTION

Accordingly, the present invention is directed to a substrate bonding apparatus for an LCD device panel that substantially obviates one or more problems due to limitations and disadvantages of the related art.

An object of the present invention is to provide a substrate bonding apparatus for an LCD device panel for reducing fabrication time and power consumption.

Additional features and advantages of the invention will be set forth in the description which follows and in part will be apparent from the description, or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a substrate bonding apparatus for a liquid crystal display device panel includes an upper chamber plate, a lower chamber plate opposing the upper chamber plate, an upper low vacuum chamber provided on the upper chamber plate, a lower low vacuum chamber provided on a rear surface of the lower chamber plate, a sealing member provided on the lower chamber plate, the sealing member projecting from a top surface of the lower chamber plate at a predetermined height to contact the upper chamber plate to form a high vacuum chamber therein, at least two holes provided in each of the upper and lower chamber plates, at least two flow shut-off systems shutting off each of the holes, vacuum pumping system for reducing pressures of the upper and lower low vacuum chambers to low vacuum states, and reducing the high vacuum chamber to a high vacuum state, and upper and lower stages provided to upper and lower chamber plates, respectively, within an inside space of the high vacuum chamber to affix first and second substrates of the liquid crystal display device panel, respectively.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3:
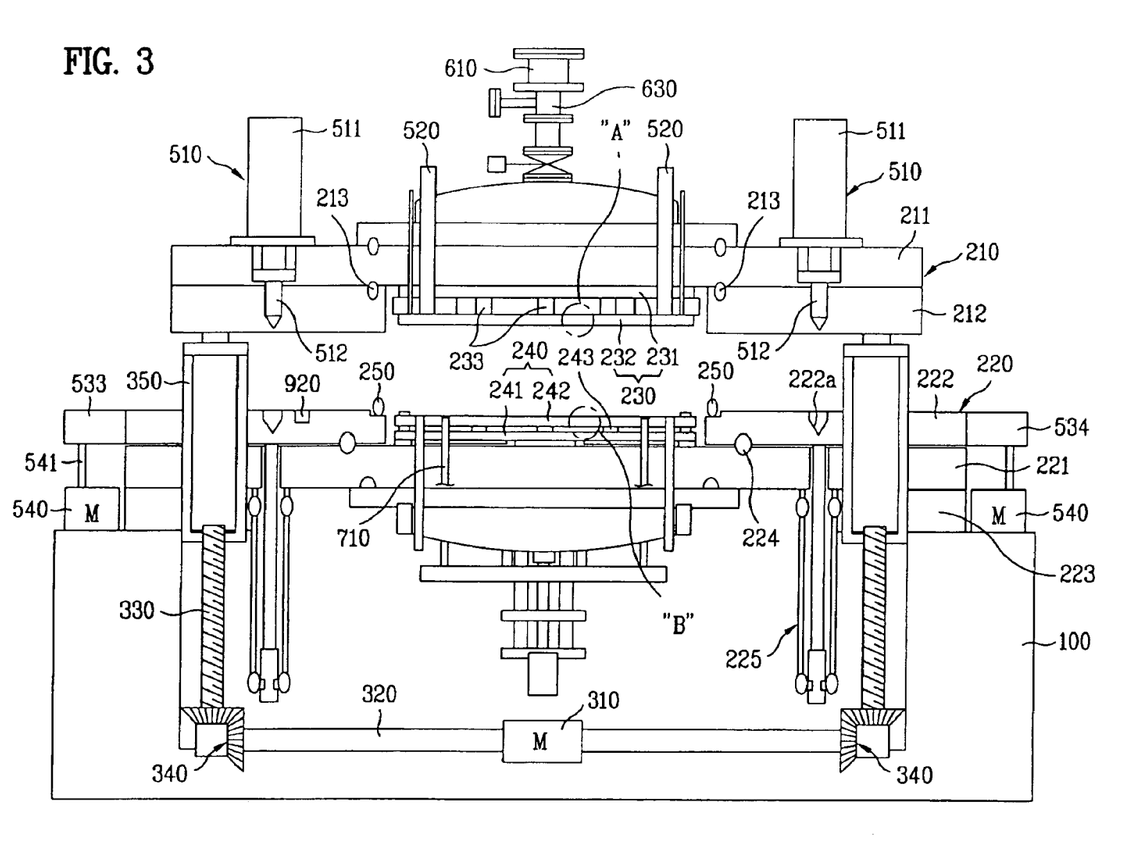
FIG. 3 is a cross sectional view of an exemplary substrate bonding apparatus for fabricating an LCD panel according to the present invention.

FIG. 3 is a cross sectional view of an exemplary substrate bonding apparatus for fabricating an LCD panel according to the present invention. In FIG. 3, a substrate bonding apparatus may include a base frame 100, an upper chamber unit 210, a lower chamber unit 220, an upper stage 230, and a lower stage 240. The substrate bonding apparatus may also include an interlocking system 510 and a support system 710. In addition, although not specifically shown, the substrate bonding apparatus may include a chamber moving system, a sealing system, alignment cameras, an alignment system, a vacuum pumping system, and high and low vacuum chambers.

The base frame 100 may be fixed to a floor structure (not shown), and may form an exterior of the substrate bonding apparatus. In addition, the base frame 100 may simultaneously support different components of the substrate bonding apparatus. The upper chamber unit 210 and the lower chamber unit 220 may be mounted with upper and lower stages 230 and 240. Accordingly, the upper chamber unit 210 and the lower chamber unit 220 may be joinable to and separable from each other. In addition, the upper chamber unit 210 may include an upper base 211 exposed to an external atmospheric environment, i.e., temperature and pressure, and an upper chamber plate 212 having an opening corresponding to the upper stage 230. Accordingly, the upper stage 230 may be positioned with the opening of the upper chamber plate 212, and may be movable within the upper chamber unit 210. In addition, a first seal member 213 may be provided between the upper base 211 and the upper chamber plate 212 of the upper chamber unit 210, for sealing an interior space of the upper chamber plate 212 from the external atmospheric environment.

The lower chamber unit 220 may include a lower base 221 affixed to the base frame 100, and a lower chamber plate 222 having an opening corresponding to the lower stage 240. In addition, the lower base 221 may be movable along X- and Y-axis directions in order to perform an alignment of the lower stage 240. Accordingly, the lower stage 240 may be provided within a space at an interior of the lower chamber plate 222, and affixed to a top surface of the lower base 221. In addition, the lower chamber unit 220 may further include a fixing plate 223 for fixing the base frame 100 and the lower base 221.

In FIG. 3, a second seal member 224 may be provided between the lower base 221 and the lower chamber plate 222 of the lower chamber unit 220 to seal an interior space of the lower chamber plate 222 in which the lower stage 240 is provided thereto from the external atmospheric environment. For example, the first seal member 213 and the second seal member 224 may include gaskets or O-rings formed of a material commonly used for sealing. In addition, at least one support part 225 may be provided between the lower base 221 and the lower chamber plate 222 for supporting the lower chamber plate 222 along with a distance to the lower base 221. Accordingly, the support part 225 may have a first end attached to a bottom portion of the lower chamber plate 222 and a second end attached to a bottom portion of the lower base 221. Thus, the support part 225 may allow for the lower chamber plate 222 to be freely moved away from the lower base 221.

The chamber moving system may include a driving motor 310 affixed to the base frame 100, driving shafts 320 connected to the driving motor 310 and extending along opposing horizontal directions, connecting shafts 330 connected to the driving shafts 320 and extending along a vertical direction, connecting parts 340 interconnecting the driving shafts 320 and the connecting shafts 340 and for translating the direction of movement along the driving shafts 320 to a direction of the connecting shafts 340, and a jack part 350 mounted at an end portion of the connecting shaft 330. The driving motor 310 may be positioned at an interior bottom portion of the base frame 100, and may be a bilateral shaft motor having a shaft projected along opposing horizontal directions. Each of the jack parts 350 disposed at the end portions of the connecting shafts 330 may have a system identical to a nut housing in order to move the upper chamber unit 210 along the vertical direction depending upon a direction of rotation of the connecting shafts 330 when the jack parts 350 are in contact with the upper chamber unit 210. In addition, the connecting parts 340 may have a system of bevel gears for translating transmission of a rotation force from the driving shafts 320 transmitted along the horizontal directions to the connecting shafts 330 along the vertical direction.

The upper stage 230 may include a fixing plate 231 fixed to the upper chamber unit 210, an adsorbing plate 232 for holding a substrate, and a plurality of fixing blocks 233 disposed between the fixing plate 231 and the adsorbing plate 232. For example, the adsorbing plate 232 may be an electrostatic chuck (ESC) for holding the substrate by an electrostatic force. In addition, the adsorbing plate 232 may include a plurality of vacuum holes (not shown) for transmission of a vacuum suction force to the substrate.

The lower stage 240 may include a fixing plate 241 affixed to the lower chamber unit 220, an adsorbing plate 242 for holding another substrate, and a plurality of fixing blocks 243 disposed between the fixing plate 241 and the adsorbing plate 242. For example, the adsorbing plate 242 may be an electrostatic chuck (ESC) for holding the substrate by an electrostatic force. In addition, the adsorbing plate 242 may include a plurality of vacuum holes (not shown) for transmission of the Vacuum suction force to the substrate.

The sealing system may include an O-ring (i.e., third seal member) 250 formed of rubber fitted along a top surface of the lower chamber plate 222 of the lower chamber unit 220 to project above an upper surface of the lower chamber plate 222. Accordingly, the third seal member 250 has a thickness in order to prevent substrates held to the upper and lower stages 230 and 240 at an interior space of the upper and lower chamber units 210 and 220 from being brought into contact with each other when the upper and lower chamber units 210 and 220 are joined together. However, the thickness of the third seal member 250 must be sufficient to permit the substrates to be brought into contact with each other when the third seal member 250 is compressed in addition, although a circular O-ring is shown, the sealing system may include various configurations and materials in order to provide sufficient performance.

The alignment system may be mounted onto the lower chamber unit 220 in order to verify positions of the substrates and to align the substrates.

The interlocking system 510 may include a plurality of holes 222a formed along a surface of the lower chamber plates 222 of the lower chamber unit 220, and a plurality of linear actuators 511 each having one end fixed to the upper chamber unit 210 for driving a movable shaft 512 into the holes 222a. Accordingly, the align system and the interlocking system may provide for a position change of the upper stage 230 by movement of the lower chamber unit 220 in order to align the substrates, although no position change of the lower stage 240 may be made.

The support system 710 may pass through the lower base 221, the lower chamber plate 222, and the fixing plate 241 and the adsorbing plate 242 of the lower stage 240. In addition, the support system 710 may project upward from the lower stage 240, for safe seating of the substrate during loading onto the lower stage 240, as well as unloading the bonded substrates that remain on the lower stage 240. Accordingly, when no loading of the substrate is performed, a top surface of the support system 710 may be positioned below a top surface of the adsorbing plate 242 of the lower stage 240.

Figure 4:
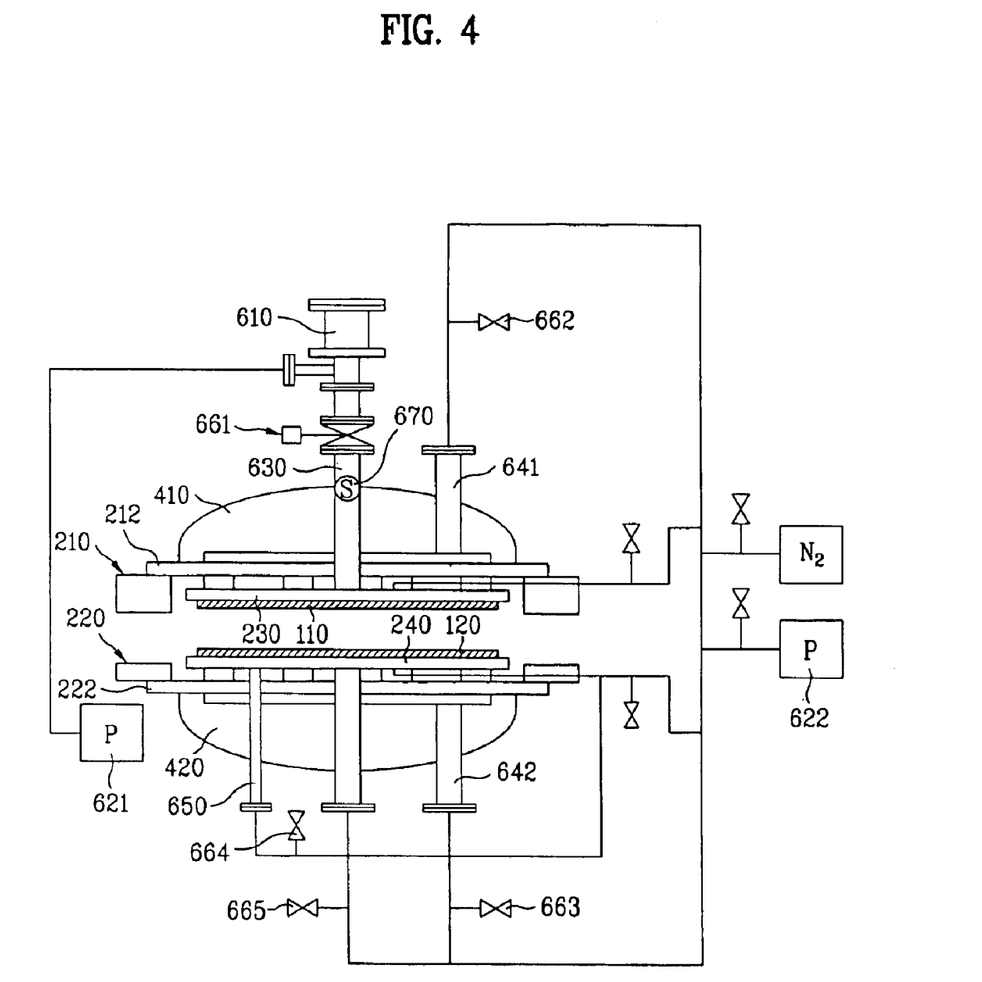
FIG. 4 is a schematic view of a vacuum pump system according to the present invention.

FIG. 4 is a schematic view of a vacuum pump system according to the present invention. In FIG. 4, a vacuum pumping system may include a first high vacuum pump 610, a second low vacuum pump 621, and a third low vacuum pump 622. The first high vacuum pump 610 may be provided at an upper region of one of the upper and lower chamber units 210 and 220 (in FIG. 3) for evacuating an interior space of the substrate bonding apparatus.

Figure 5:
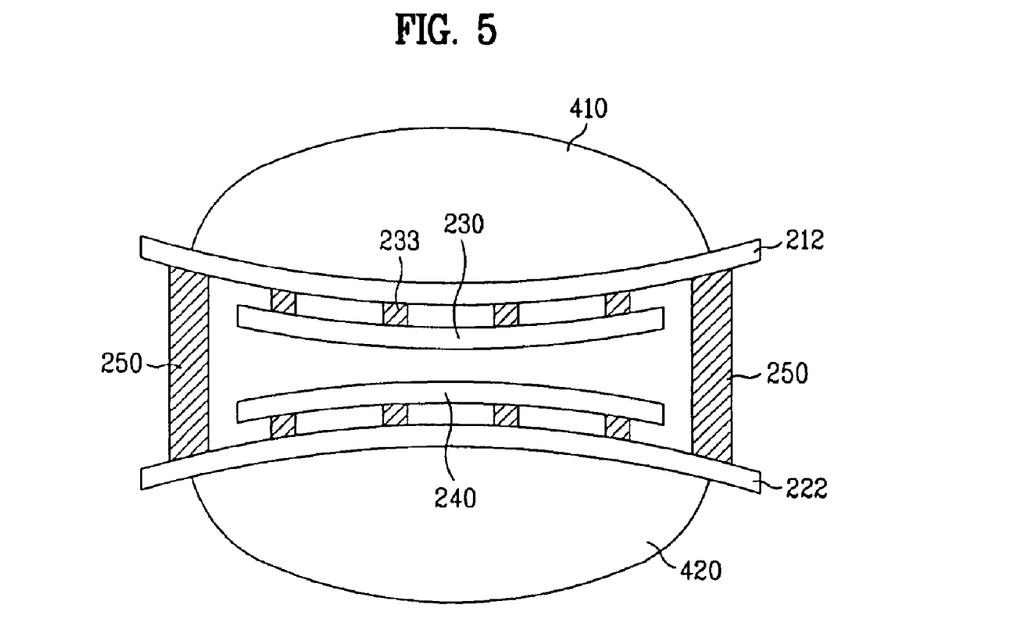
FIG. 5 is a schematic cross sectional view of an exemplary chamber plate according to the present invention.

In FIG. 4, upper and lower low-vacuum chambers 410 and 420 may be provided to a top surface of the upper chamber plate 212 and a bottom surface of the lower chamber plate 222, thereby preventing the upper and lower chamber plates 212 and 222 from being deformed, as shown in FIG. 5, due to pressure differences between each of the upper and lower low-pressure chambers 410 and 420 and the interior of the substrate bonding apparatus. Accordingly, the upper and lower low-vacuum chambers 410 and 420 may be connected to the second and third low-vacuum pumps 621 and 622, respectively, to reduce the pressure within the upper and lower low-vacuum chambers 410 and 420. For example, the upper chamber plate 212 may be affixed to a lower side of the upper low-vacuum chamber 410, and the lower chamber plate 222 may be affixed to an upper side of the lower low-vacuum chamber 420.

Accordingly, the interior of the substrate bonding apparatus may sealed when the upper and lower chamber units 210 and 220 are sealed together with the third seal member 250. Then, a pressure within the interior of the sealed space may be reduced to a high vacuum state by the first vacuum pump 610.

An exemplary vacuum pumping process of the space inside the substrate bonding apparatus according to the present invention may include, as shown in FIG. 4, use of the second low vacuum pump 621 connected to a high vacuum chamber pipeline 630 passing through a center of the upper chamber 410 and a center of the upper chamber plate 212. In addition, the high vacuum chamber pipeline 630 may be connected to the inside space of the substrate bonding apparatus through the upper and lower chamber plates 212 and 222 via the high vacuum chamber pipeline 630. Accordingly, the third low vacuum pump 622 may be connected to a first low vacuum chamber pipeline 641 and a second low-vacuum pump pipeline 642 passing through the lateral side of the upper chamber plate 212 and the lower chamber plate 222 that are also connected a substrate adsorbing pipeline (not shown) connected to vacuum pipelines in the upper and lower stages 230 and 240 for vacuum adsorption of first and second substrates 110 and 120. In addition, each of the pipelines may have at least one shut off valve.

In FIG. 4, the high vacuum chamber pipeline 630 may have a pressure sensor 670 fitted thereto for measuring a pressure inside the space to which the first and second substrates 110 and 120 are held to the upper and lower stages 230 and 240. Accordingly, the pipelines 641, 642, and 650 that are in communication with the third low vacuum pump 622 may also be used as pipelines for venting. During venting, gas, such as $N_2$ gas, may be injected into the inside spaces of the upper and lower chamber units 210 and 220 to increase the pressure to the exterior atmospheric conditions.

According to the present invention, an exemplary operation of the substrate bonding apparatus may include the first and second substrates 110 and 120 for bonding may be loaded by loading system (not shown) when the upper chamber unit 210, including the upper low-vacuum chamber 410, and the upper chamber plate 212 are moved upwardly by the first driving motor 310. Accordingly, the first substrate 110 may be affixed to the upper stage 230, and the second substrate 120 may be affixed to the lower stage 240 by adsorption.

Then, after aligning the first and second substrates 110 and 120 to each other, the upper chamber unit 210 may be moved downwardly by the first driving motor 310, thereby sealing the upper and lower chamber units 210 and 220 together using the third seal member 250. Next, the first and second substrates 110 and 120 may be preliminarily bonded to each other, wherein the upper and lower low vacuum chambers 410 and 420 may be maintained in a low vacuum state. In addition, the sealed upper and lower chamber units 210 and 220 may form the low vacuum state by driving the second low vacuum pump 621, and may selectively maintain the high vacuum state above a predetermined vacuum level by driving the first high vacuum pump 610. Accordingly, the upper and lower low vacuum chambers 410 and 420 may be provided along a circumference of the sealed upper and lower chamber units 210 and 220 to prevent the upper plate 212 and the lower plate 222 from being deformed by the pressure differences between the high vacuum pressure of the sealed upper and lower chamber units 210 and 220 and the exterior atmospheric pressure.

After primarily bonding the first and second substrates 110 and 120 together in the high vacuum state, pumping of the vacuum pumps 610, 621, and 622 may be stopped, and gas may be injected to increase the pressure within the sealed upper and lower chamber units 210 and 220 to the exterior atmospheric pressure. Accordingly, the space between the bonded first and second substrates 110 and 120 is maintained in the high vacuum state and the exterior space to the bonded first and second substrates 110 and 120 is maintained in the exterior atmospheric pressure state, whereby the first and second substrates 110 and 120 may be secondarily and firmly bonded to each other by the pressure difference. Then, the sealed upper and lower chamber units 210 and 220 may be separated by driving of the first driving motor 310, and the bonded first and second substrates 110 and 120 may be unloaded to an exterior of the substrate bonding apparatus by the loading means (not shown), and transported for further processing.

For example, as shown in FIG. 5, the inside space between the upper chamber plate 212 and the lower chamber plate 222 may be maintained at a pressure of about 1 Pa, and a pressure of each of the upper and lower low vacuum chambers 410 and 420 may be within about 1 Kpa. Accordingly, the upper chamber plate 212 and the lower chamber plate 222 may be partially deformed by the pressure differences between the high vacuum chamber and the low vacuum chamber. Accordingly, when the upper and lower chamber plates 212 and 222 are deformed, the upper and lower stages 230 and 240 affixed to the upper and lower chamber plates 212 and 222, respectively, may be affected. Thus, it may be difficult to precisely bond the first and second substrates 110 and 120 together. Specifically, as sizes of the first and second substrates 110 and 120 increases, the upper and lower chamber plates 212 and 222 may also increase, thereby increasing the deformation of the upper and lower chamber plates 212 and 222.

Figure 6:
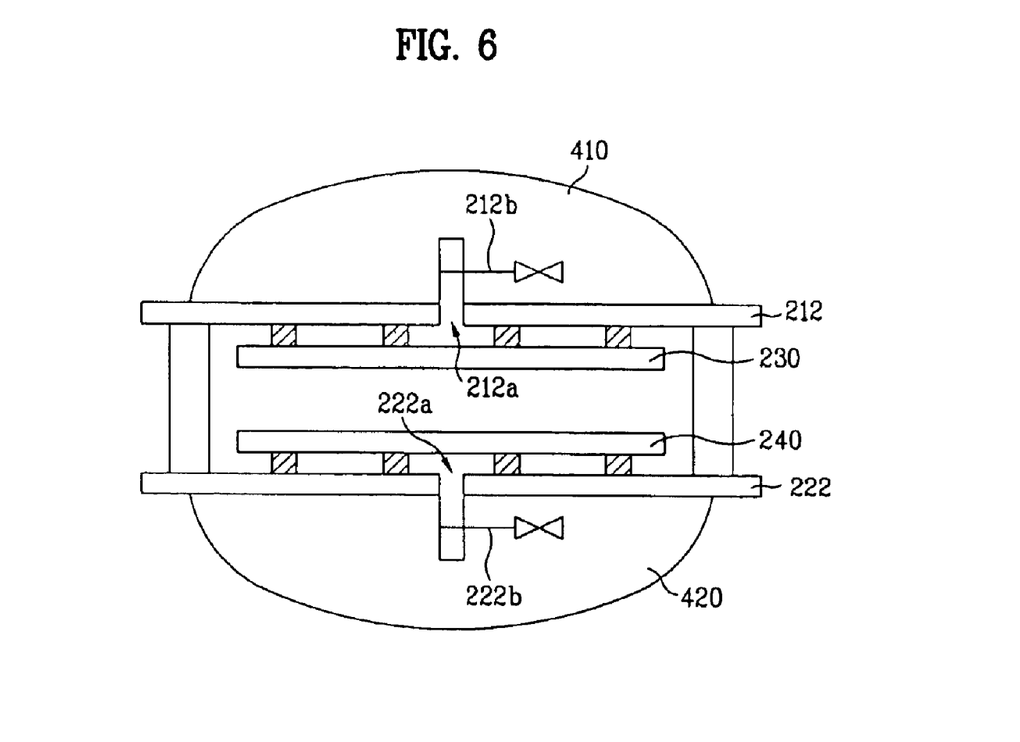
FIG. 6 is a schematic cross sectional view of an exemplary substrate bonding system according to the present invention.

FIG. 6 is a schematic cross sectional view of an exemplary substrate bonding system according to the present invention. In FIG. 6, a substrate bonding apparatus may include holes 212a and 222a provided in the upper chamber plate 212 and the lower chamber plate 222 for sectioning the upper and lower low vacuum chambers 410 and 420 and the high vacuum chamber. Alternatively, although FIG. 6 only shows two of the holes 212a and 222a, more than two holes may be provided along the upper and lower chamber plates 212 and 222 to compensate for the pressure differences between the upper and lower low vacuum chambers 410 and 420 and the high vacuum chamber. When the upper and lower chamber plates 212 and 222 are deformed by the pressure differences between the upper and lower low vacuum chambers 410 and 420 and the. high vacuum chamber, center portions of the upper and lower chamber plates 212 and 222 may become severely deformed. Thus, a plurality of holes 212a and 222a may be provided in the center portions of the upper and lower chamber plates 212 and 222. In addition, solenoid valves 212b and 222b may be provided corresponding to the holes 212a and 222a to shut off the holes 212a and 222a according to external control signals.

According to the present invention, an exemplary method of shutting off the solenoid valves 212b and 222b of a substrate bonding apparatus may include shutting off the solenoid valves 212b and 222b by the external control signal when the high vacuum chamber is opened as the upper chamber unit 210 including the upper low-vacuum chamber 410 and the upper chamber plate 212 is moved upward by the first driving motor 310 (in FIG. 4). Accordingly, when the solenoid valves 212b and 222b are shut off, the inside spaces of the upper and lower low vacuum chambers 410 and 420 are in the vacuum state by the second and third low vacuum pumps 621 and 622 (in FIG. 4). Then, the first and second substrates 110 and 120 for bonding may be loaded by the loading system (not shown). Next, the first substrate 110 may be affixed to the upper stage 236 and the second substrate 120 may be affixed to the lower stage 240 by adsorption.

Then, after aligning the first and second substrates 110 and 120 to each other, the upper chamber unit 210 may be moved downward by the first driving motor 310, thereby sealing the upper and lower chamber units 210 and 220 together by the third seal member 250 (in FIG. 4). Next, the first and second substrates 110 and 120 may be preliminarily bonded to each other. If the upper and lower chamber units 210 and 220 are sealed together by the third seal member 250, the vacuum degree of the upper and lower low vacuum chambers 410 and 420 may be the same as that of the sealed the upper and lower chamber units 210 and 220 by opening the solenoid valves 212b and 222b in the respective pipelines 212a and 222a. For example, when the sealed upper and lower chamber units 210 and 220 are maintained at the high vacuum state above the predetermined vacuum level by driving the second low vacuum pump 621 and the first high vacuum pump 610 without opening the solenoid valves 212b and 222b, the upper and lower chamber plates 212 and 222 may be deformed by the pressure differences between the upper and lower low vacuum chambers 410 and 420 and the sealed the upper and lower chamber units 210 and 220. Accordingly, after the sealed upper and lower chamber units 210 and 220 and the upper and lower low vacuum chambers 410 and 420 are maintained at the same vacuum level state by opening the solenoid valves 212b and 222b, the pressures within the sealed the upper and lower chamber units 210 and 220 may be changed to the low vacuum state by driving the second low vacuum pump 621. Then, the sealed upper and lower chamber units 210 and 220 may be maintained at the high vacuum state above the predetermined vacuum level by driving the first high vacuum pump 610.

After primarily bonding the first and second substrates 110 and 120 together at the high vacuum state, the vacuum pumping may be stopped, and gas may be injected to the inside space of the sealed upper and lower chamber units 210 and 220, thereby converting the inside space of the sealed upper and lower chamber units 210 and 220 to the exterior atmospheric pressure state. In addition, the inside space between the bonded first and second substrates 110 and 120 may be maintained in the high vacuum state, and an exterior of the bonded first and second substrates 110 and 120 may be maintained in the exterior atmospheric pressure state. Thus, the bonded first and second substrates 110 and 120 may be secondarily and firmly bonded to each other by the pressure difference. Then, the sealed upper and lower chamber units 210 and 220 may be separated, and the solenoid valves 212b and 222b may be shut off. Accordingly, the upper and lower low vacuum chambers 410 and 420 may be maintained in the low vacuum state, and the bonded first and second substrates 110 and 120 may be unloaded to the outside by the loading means (not shown), and transported for additional processing.

According to the present invention, bonding first and second substrates together may be achieved without movement of upper and lower chambers, thereby maintaining a reasonable size of a substrate bonding apparatus. For example, when large-sized substrates are bonded to each other, the bonding process may be performed by controlling a size of a bonding part of the substrate bonding apparatus without the use of additional components, thereby preventing an increase in the size of the substrate bonding apparatus.

According to the present invention, a substrate bonding apparatus may include a upper chamber unit having a vertical movement along up and down directions, thereby aligning first and second substrates during a bonding process.

According to the present invention, a substrate bonding apparatus may include a high vacuum chamber to function as a bonding part. For example, the high vacuum chamber may be formed having a minimum size, and the chamber may be moved by relatively small distances during opening or sealing of the high vacuum chamber. Accordingly, introduction of air and foreign materials into the high vacuum chamber may be prevented. In addition, fabrication processing time and power consumption may be reduced.

According to the present invention, a low vacuum chamber may be provided along a circumference of a high vacuum chamber to compensate for pressure differences between the high vacuum chamber and an atmospheric pressure state, thereby enabling a stable evacuating process.

According to the present invention, holes may be provided in upper and lower plates for sectioning a high vacuum chamber and upper and lower low vacuum chambers, thereby compensating for pressure differences between the chambers. In addition, chamber plates of each of the upper and lower low pressure chambers may be prevented from becoming deformed, thereby providing for precise bonding of first and second substrates.

It will be apparent to those skilled in the art that various modifications and variations can be made in the substrate bonding apparatus for a liquid crystal display device panel of the present invention without departing from the spirit or scope of the invention. Thus, it is intended that the present invention covers the modifications and variations of this invention provided they come within the scope of the appended claims and their equivalents.

What is claimed is:

1. A substrate bonding apparatus for a liquid crystal display device panel, comprising:
   an upper chamber plate;
   a lower chamber plate opposing the upper chamber plate;
   an upper low vacuum chamber provided on the upper chamber plate;
   a lower low vacuum chamber provided on a rear surface of the lower chamber plate;
   a sealing member provided on the lower chamber plate, the sealing member projecting from a top surface of the lower chamber plate at a predetermined height to contact the upper chamber plate to form a high vacuum chamber therein;
   at least two holes provided in each of the upper and lower chamber plates;
   at least two flow shut-off systems shutting off each of the holes;
   vacuum pumping system for reducing pressures of the upper and lower low vacuum chambers to low vacuum states, and reducing the high vacuum chamber to a high vacuum state; and
   upper and lower stages provided to upper and lower chamber plates, respectively, within an inside space of the high vacuum chamber to affix first and second substrates of the liquid crystal display device panel, respectively.

2. The apparatus according to claim 1, wherein at least two holes are provided within center regions of each of the upper plate and the lower plate.

3. The apparatus according to claim 1, wherein the upper chamber plate and the upper low vacuum chamber are moved along upward and downward directions by a first driving system.

4. The apparatus according to claim 1, wherein the upper and lower stages are affixed to the upper and lower plates, respectively, by fixing blocks.

5. The apparatus according to claim 1, wherein at least one electrostatic chuck is mounted on a lower surface of the upper stage and an upper surface of the lower stage to hold the first and second substrates by electrostatic force, and at least one hole is provided to hold the first and second substrates with a vacuum suction force.

6. The apparatus according to claim 1, wherein the sealing member includes an O-ring.

7. The apparatus according to claim 1, wherein the flow shut off system includes a solenoid valve.

8. The apparatus according to claim 1, further comprising an interlock system provided on the upper chamber plate.

9. The apparatus according to claim 8, wherein the interlock system includes a plurality of linear actuators extending through the upper chamber plate.

10. The apparatus according to claim 9, wherein the linear actuators extend into holes formed along the top surface of the lower chamber plate.

* * * * *